(12) United States Patent
Yen et al.

(10) Patent No.: US 9,202,785 B2
(45) Date of Patent: Dec. 1, 2015

(54) THREE DIMENSIONAL INTEGRATED CIRCUIT CAPACITOR HAVING VIAS

(71) Applicant: TAIWAN SEMICONDUCTOR MANUFACTURING COMPANY, LTD., Hsinchu (TW)

(72) Inventors: Hsiao-Tsung Yen, Tainan (TW); Cheng-Wei Luo, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/074,972

(22) Filed: Nov. 8, 2013

(65) Prior Publication Data

US 2015/0130023 A1     May 14, 2015

(51) Int. Cl.
     *H01L 21/02*      (2006.01)
     *H01L 23/522*      (2006.01)
     *H01L 49/02*      (2006.01)

(52) U.S. Cl.
     CPC ............ *H01L 23/5223* (2013.01); *H01L 28/86* (2013.01); *H01L 28/90* (2013.01)

(58) Field of Classification Search
     CPC ....... H01L 29/792; H01L 29/66; H01L 49/02; H01L 27/08
     USPC .................................. 257/324, 532; 438/287
     See application file for complete search history.

(56) References Cited

U.S. PATENT DOCUMENTS

| | | | |
|---|---|---|---|
| 6,992,349 B2 * | 1/2006 | Lee et al. ...................... | 257/324 |
| 7,274,067 B2 * | 9/2007 | Forbes ......................... | 257/316 |
| 7,635,891 B2 * | 12/2009 | Natori et al. ................. | 257/324 |
| 8,441,059 B2 * | 5/2013 | Sim et al. ..................... | 257/324 |
| 8,836,011 B2 * | 9/2014 | Uenaka et al. ................ | 257/324 |
| 8,956,968 B2 * | 2/2015 | Higashitani et al. .......... | 438/630 |
| 2009/0230449 A1 * | 9/2009 | Sakaguchi et al. ............ | 257/298 |
| 2010/0230735 A1 | 9/2010 | Zhu | |
| 2011/0086487 A1 | 4/2011 | Baumgartner et al. | |
| 2011/0175159 A1 * | 7/2011 | Itagaki et al. ................. | 257/326 |
| 2012/0115293 A1 * | 5/2012 | Noh et al. ..................... | 438/239 |
| 2012/0306018 A1 * | 12/2012 | Gates et al. ................... | 257/368 |
| 2012/0319238 A1 * | 12/2012 | Chuang et al. ................ | 257/532 |

(Continued)

FOREIGN PATENT DOCUMENTS

DE     11 2010 003 418      8/2012

OTHER PUBLICATIONS

Office Action dated May 19, 2014 from corresponding application No. DE 10 2013 113 678.8.

*Primary Examiner* — Caleb Henry
(74) *Attorney, Agent, or Firm* — Hauptman Ham, LLP

(57) ABSTRACT

A three dimensional integrated circuit capacitor that includes a first conductive layer, a second conductive layer above the first conductive layer and a semiconductor layer above the second conductive layer. The semiconductor layer has an inter layer via (ILV) through the semiconductor layer. A third conductive layer is above the semiconductor layer and a fourth conductive layer is above the third conductive layer. A first conductive plate has fingers on at least two of the first conductive layer, the second conductive layer, the third conductive layer and the fourth conductive layer. A second conductive plate has fingers on at least two of the first conductive layer, the second conductive layer, the third conductive layer and the fourth conductive layer. An insulating layer is between the first conductive plate and the second conductive plate.

20 Claims, 5 Drawing Sheets

(56) References Cited

U.S. PATENT DOCUMENTS

| | | |
|---|---|---|
| 2013/0105873 A1* | 5/2013 | Kim et al. .................. 257/296 |
| 2013/0113080 A1* | 5/2013 | Hioka et al. ................ 257/532 |
| 2013/0127011 A1* | 5/2013 | Higashitani et al. ........ 257/532 |
| 2013/0194032 A1 | 8/2013 | Hollis |
| 2013/0256834 A1 | 10/2013 | Tan et al. |
| 2013/0277802 A1* | 10/2013 | Park et al. .................. 257/532 |
| 2013/0292754 A1* | 11/2013 | An et al. .................... 257/300 |
| 2014/0061766 A1* | 3/2014 | Kito et al. .................. 257/324 |
| 2014/0061767 A1* | 3/2014 | Nakaki ...................... 257/324 |
| 2014/0061768 A1* | 3/2014 | Shinohara .................. 257/324 |
| 2014/0061769 A1* | 3/2014 | Toratani et al. ............ 257/324 |
| 2014/0175534 A1* | 6/2014 | Kofuji et al. ............... 257/324 |
| 2014/0284685 A1* | 9/2014 | Shimojo et al. ............ 257/324 |
| 2014/0284688 A1* | 9/2014 | Hirai et al. ................. 257/324 |
| 2014/0284692 A1* | 9/2014 | Akutsu et al. .............. 257/324 |
| 2014/0284694 A1* | 9/2014 | Kitazaki et al. ............ 257/324 |

* cited by examiner

US 9,202,785 B2

THREE DIMENSIONAL INTEGRATED CIRCUIT CAPACITOR HAVING VIAS

BACKGROUND

The semiconductor integrated circuit (IC) industry has produced a wide variety of digital devices at decreasing cost to address issues in a number of different areas. This has been achieved at least in part due to increasing integration density. The integration density of various integrated circuit components such as transistors, diodes, resistors and capacitors have benefited from continual reductions in minimum feature size that in turn allow more components to be integrated into a given area. Because reducing minimum feature sizes through photolithographic improvements is becoming increasingly difficult, recent improvements in integration density have been achieved with new three dimensional integrated circuit (3DIC) structures having multiple layers. However, while higher integration density has allowed various radio frequency (RF) circuits and analog to digital converter (ADC) circuits to improve integration density, the corresponding demands on capacitors used by those RF and ADC circuits have also increased. It would be beneficial to mitigate or resolve problems associated with capacitors in 3D ICs.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1A:
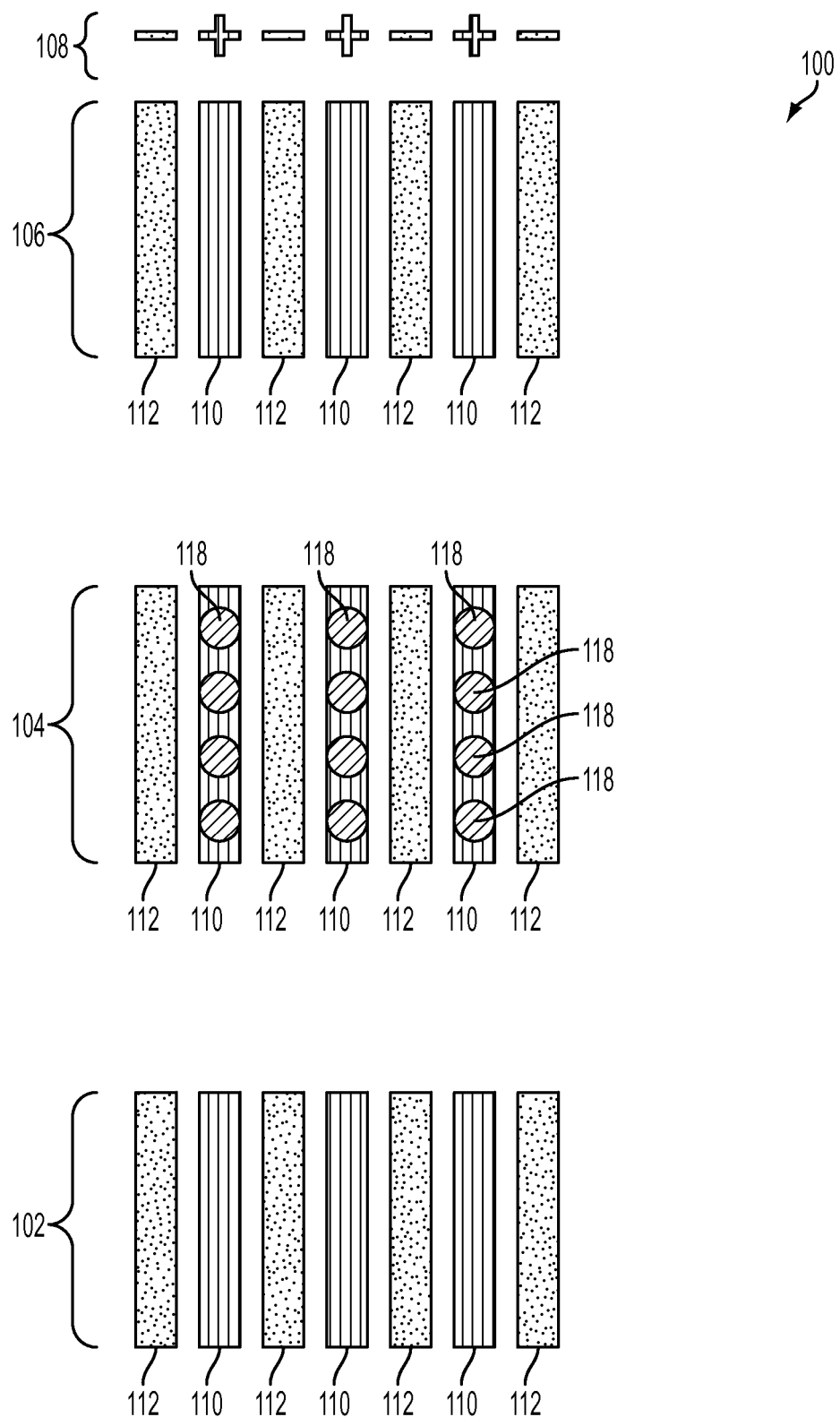
FIG. 1A is a top view of three layers a three dimensional integrated circuit capacitor in accordance with one or more embodiments.

The following disclosure provides many different embodiments, or examples, for implementing different features of the invention. Specific examples of components and arrangements are described below to simplify the present disclosure. These are examples and are not intended to be limiting.

This description of the various embodiments is intended to be read in connection with the accompanying drawings, which are to be considered part of the entire written description. In the description, relative terms such as "before," "after," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the system be constructed or operated in a particular orientation. Terms concerning attachments, coupling and the like, such as "connected" and "interconnected," refer to a relationship wherein components are attached to one another either directly or indirectly through intervening components, unless expressly described otherwise.

Applications employing higher device integration density strategies, such as wafer level chip scale package (WLCSP) and other three-dimensional integrated circuit (3DIC) packaging techniques, correspondingly require higher capacitance density. The need for higher capacitance is particularly acute in various radio frequency (RF) circuits and analog to digital converter (ADC) circuits to have improved integration density. Furthermore, fine control over capacitance value is useful for both RF and ADC applications. In at least some embodiments, one or more of these problems associated with providing higher capacitance density are mitigated and/or resolved by a three dimensional integrated circuit (3DIC) capacitor structure. By mitigating or resolving issues associated with providing higher capacitance density, device geometries can continue to shrink.

FIG. 1A is a top view of each of three layers of a three dimensional integrated circuit capacitor 100 in accordance with one or more embodiments. In some embodiments, the integrated circuit capacitor 100 includes a first conductive layer 102 below a second conductive layer 104 below a third conductive layer 106. In some embodiments, there are more than three conductive layers. In some embodiments, there are less than three conductive layers. Each conductive layer 102, 104, 106 is patterned by a known photolithographic technique. As described below, electrical charges 108 are shown above portions of the first conductive layer 102, the second conductive layer 104 and the third conductive layer 106. The first conductive layer 102 is patterned by the photolithographic technique to form a first conductive plate 110 having elongated portions (also referred to hereinafter as "fingers") and a second conductive plate 112 also having fingers. In some embodiments, the first conductive plate 110 and the second conductive plate 112 are formed from a conductive material selected from copper, aluminum, gold, silver, alloys thereof, or other suitable conductors. Each of the conductive layers 102, 104, 106 are formed sequentially upwards from the bottom with one or more insulating layers between the conductive layers to form capacitor 100 as described herein. The first conductive plate 110 and the second conductive plate are separated by one or more insulating layers having a sufficient dielectric constant (k) to form capacitor 100.

Figure 1B:
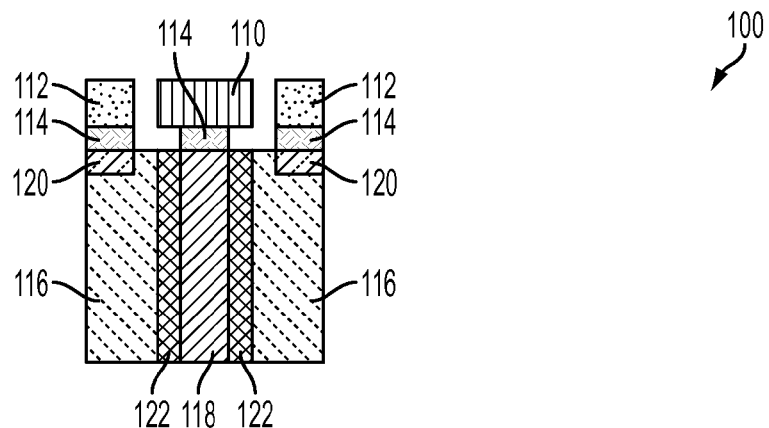
FIG. 1B is a partial side view of a three dimensional integrated circuit capacitor in accordance with one or more embodiments.
Figure 1C:
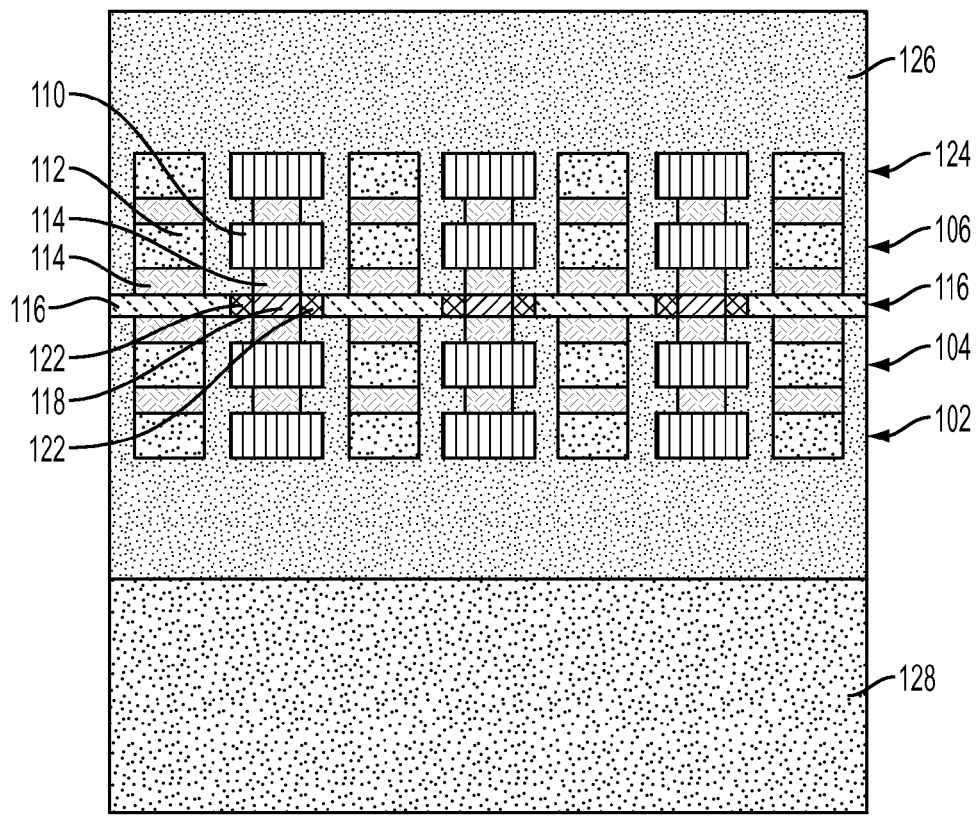
FIG. 1C is a side view of a three dimensional integrated circuit capacitor in accordance with one or more embodiments.

An insulating layer 126, illustrated in FIG. 1C, is formed over the first conductive layer 102 and connection vias 114, illustrated in FIGS. 1B and 1C, are formed in the insulating layer. In some embodiments, some connection vias 114 are replaced with inter layer vias (ILVs). In some embodiments, some connection vias 114 are replaced with through substrate vias (TSVs). In some embodiments, some connection vias 114 are replaced with inter tier vias (ITVs). The second conductive layer 104 is formed over the first conductive layer 102 and is electrically connected to the first conductive layer through the deposition of conductive material into the connection vias 114. A semiconductor layer 116, illustrated in FIGS. 1B and 1C, is formed over the second conductive layer 104 and inter layer vias (ILVs) 118 are formed in the semiconductor layer 116. The semiconductor layer 116 is not limited to a particular semiconductor and may be a single element, such as silicon (Si) or compound semiconductor, such as gallium nitride (GaN). The semiconductor layer 116 is p-type doped. In some embodiments, the semiconductor layer 116 is n-type doped.

The third conductive layer 106 is formed over the second conductive layer 104 and is electrically connected to the second conductive layer 104 through the deposition of conductive material into the ILVs 118 and connection vias 114. The vias 114 selectively, electrically couple portions of the first conductive layer 102, second conductive layer 104 and third conductive layer 106 to form the first conductive plate 110 in the three dimensional integrated circuit capacitor 100. Other vias 114 selectively, electrically couple portions of the first conductive layer 102, second conductive layer 104 and third conductive layer 106 to form the second conductive plate 112 in the three dimensional integrated circuit capacitor 100. Different configurations of the first plate 110 and second plate 112 are described below.

For illustration purposes, the first conductive plate 110 and the second conductive plate 112 are shown as having electrical charges 108. The first conductive plate 110 is shown as having a positive electrical charge 108 and second conductive plate 112 is shown as having a negative electrical charge 108. In some embodiments, the first conductive plate 110 has a negative electrical charge 108 and second conductive plate 112 has a positive electrical charge 108. In some embodiments, the insulator in the capacitor 100 is an oxide and the capacitor 100 has metal oxide metal capacitor (MOMCAP) portions between the first conductive plate 110 and the second conductive plate 112 on conductive layers 102, 104, 106. In some embodiments, the capacitor 100 also includes metal oxide semiconductor (MOSCAP) portions having the ILVs 118.

FIG. 1B is a partial side view of three dimensional integrated circuit capacitor 100 in accordance with one or more embodiments. The ILV 118 is electrically connected to the first conductive plate 110 in the third conductive layer 106 through connection via 114. Similarly, the second conductive plate 112 in the third conductive layer 106 is electrically connected to a p-type doped semiconductor layer 116 through p-wells (or p type implement) 120 and connection vias 114. In some embodiments, the semiconductor layer 116 and p-wells 120 are n-type. An insulating layer 122 separates the semiconductor layer 116 and the ILV 118.

FIG. 1C is a side view of three dimensional integrated circuit capacitor 100 in accordance with one or more embodiments. The capacitor 100 includes the first conductive layer 102 below the second conductive layer 104, the second conductive layer 104 below the third conductive layer 106 and the third conductive layer 106 below a fourth conductive layer 124.

The first conductive plate 110 in the third conductive layer 106 is electrically connected through the connection via 114 to the ILV 118. The ILV 118 passes through the semiconductor layer 116. The second conductive plate 112 in the third conductive layer 106 is electrically connected through the connection via 114 to the p-well 120 and the p-type doped semiconductor layer 116. Insulating layer 122 separates the semiconductor layer 116 and the ILV 118. A portion of the capacitor 100 that includes the ILV 118 is a MOSCAP while portions above and below the MOSCAP are MOMCAPs. The capacitor 100 includes insulating layers 126 formed over a substrate 128.

In some embodiments conductive layers 102, 104, 106, 108 are formed of a conductive material selected from copper, aluminum, gold and silver, alloys thereof or other suitable conductors. In some embodiments the insulating layers 122, 126 are formed of silicon oxide, silicone dioxide, silicon nitride, low dielectric constant (low-)k dielectric materials such as carbon doped oxides, extremely low-k dielectric materials such as porous carbon doped silicon dioxide, or a combination thereof.

Figure 2:
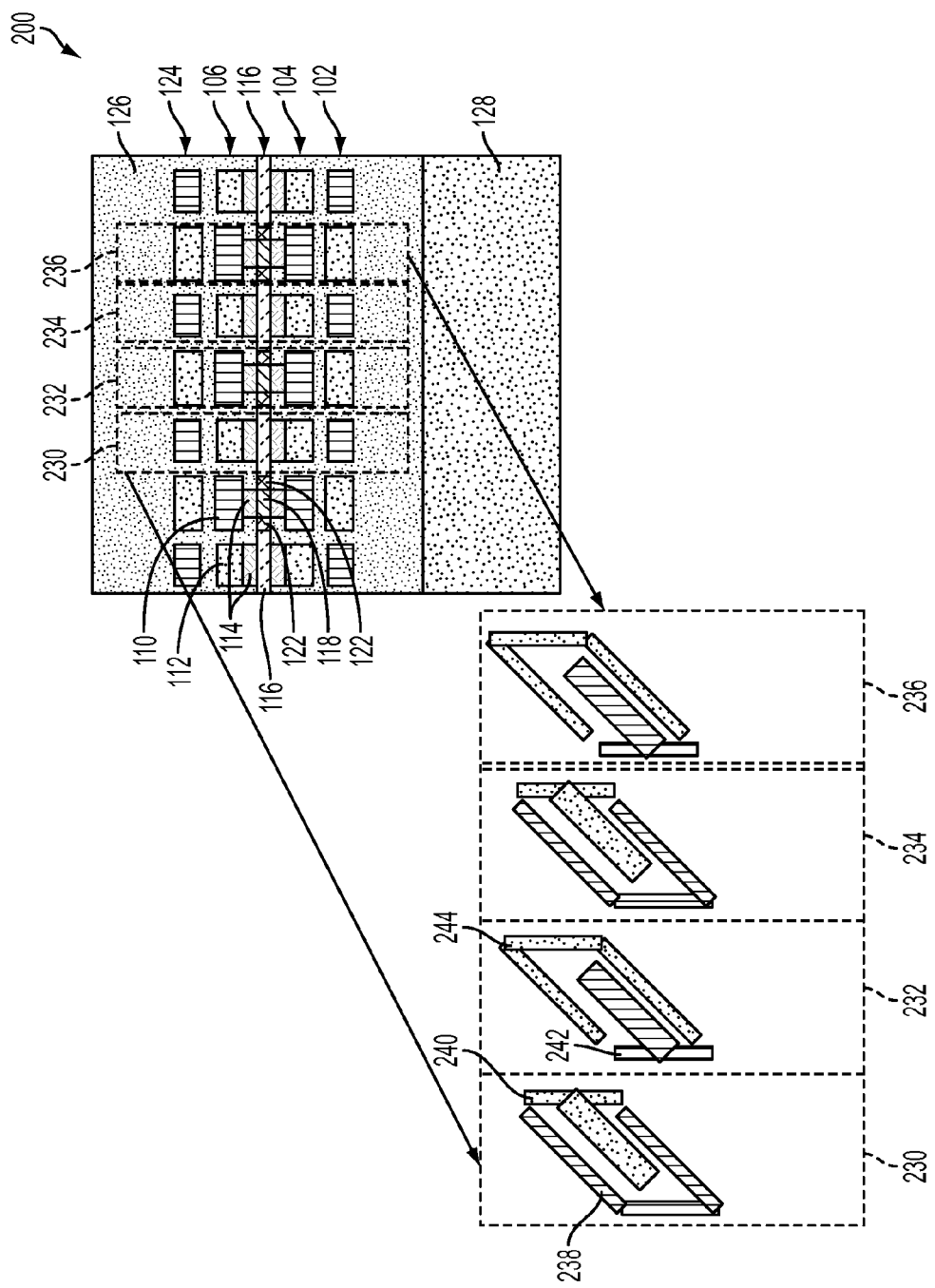
FIG. 2 is a side view with a corresponding perspective view of a three dimensional integrated circuit capacitor in accordance with one or more embodiments.

FIG. 2 is a side view with a corresponding perspective view of a three dimensional integrated circuit capacitor 200 in accordance with one or more embodiments. The capacitor includes the first conductive layer 102 below the second conductive layer 104, the second conductive layer 104 below the third conductive layer 106 and the third conductive layer 106 below the fourth conductive layer 124.

The first conductive plate 110 in the third conductive layer 106 is electrically connected through the connection via 114 to the ILV 118. The ILV 118 passes through the semiconductor layer 116. The second conductive plate 112 in the third conductive layer 106 is electrically connected through the connection via 114 to the p-well 120 and the p-type doped semiconductor layer 116. Insulating layer 122 separates the semiconductor layer 116 and ILV 118. A portion of the capacitor 200 that includes the ILV 118 is a MOSCAP while portions above and below the MOSCAP are MOMCAPs. The capacitor 200 includes insulating layer 126 formed over a substrate 128.

The capacitor 200 includes a capacitive section 230 adjacent to a capacitive section 232. The capacitive section 232 is adjacent to a capacitive section 234. The capacitive section 234 is adjacent to a capacitive section 236. Capacitive sections 230, 232, 234, 236 are shown in side view in an upper right portion of FIG. 2 and in perspective view in a lower left portion of FIG. 2. The first conductive plate 110 and the second conductive plate 112 within the capacitive sections 230, 232, 234, 236 have horizontal and vertical fingers. The capacitive section 230 includes a U-shaped first conductive plate portion 238 having a horizontal finger in the first conductive layer 102, a horizontal finger in the fourth conductive layer 124, and a vertical finger in four conductive layers 102, 104, 106, 124 electrically connected to the horizontal fingers. The capacitive section 230 includes a T-shaped second conductive plate portion 240 having a horizontal finger in the second conductive layer 104, a horizontal finger in the third conductive layer 106 and a vertical finger in four conductive layers 102, 104, 106, 124 electrically connected to the horizontal fingers. The T-shaped portion 240 fits inside the U-shaped portion 238, as shown in FIG. 2, and is separated by insulating layers 122, 126. In some embodiments, every other capacitive section, such capacitive section 230 and capacitive section 234, have a U-shaped portion 238 and T-shaped portion 240.

The capacitive section 232 includes a T-shaped first conductive plate portion 242 having a horizontal finger in the second conductive layer 104, a horizontal finger in the third conductive layer 106 and a vertical finger in four conductive layers 102, 104, 106, 124 electrically connected to the horizontal fingers. The capacitive section 232 includes a U-shaped second conductive plate portion 244 having a horizontal finger in the first conductive layer 102, a horizontal finger in the fourth conductive layer 124, and a vertical finger in four conductive layers 102, 104, 106, 124 electrically connected to the horizontal fingers. The T-shaped portion 242 fits inside the U-shaped portion 244, as shown in FIG. 2, and is separated by insulating layers 122, 126. In some embodiments, every other capacitive section, such capacitive section 232 and capacitive section 236, have the T-shaped portion 242 and the U-shaped portion 244. In some embodiments there are more than four capacitive sections 230, 232, 234, 236, however, the number of capacitive sections is not limited to any particular numerical value.

The capacitor 200 has capacitive sections 230, 232, 234, 236 that alternate between the U-shaped portions 238, 244 and the T-shaped portions 240, 242 to form a three dimensional integrated circuit structure having MOSCAP and MOMCAP type portions.

Figure 3:
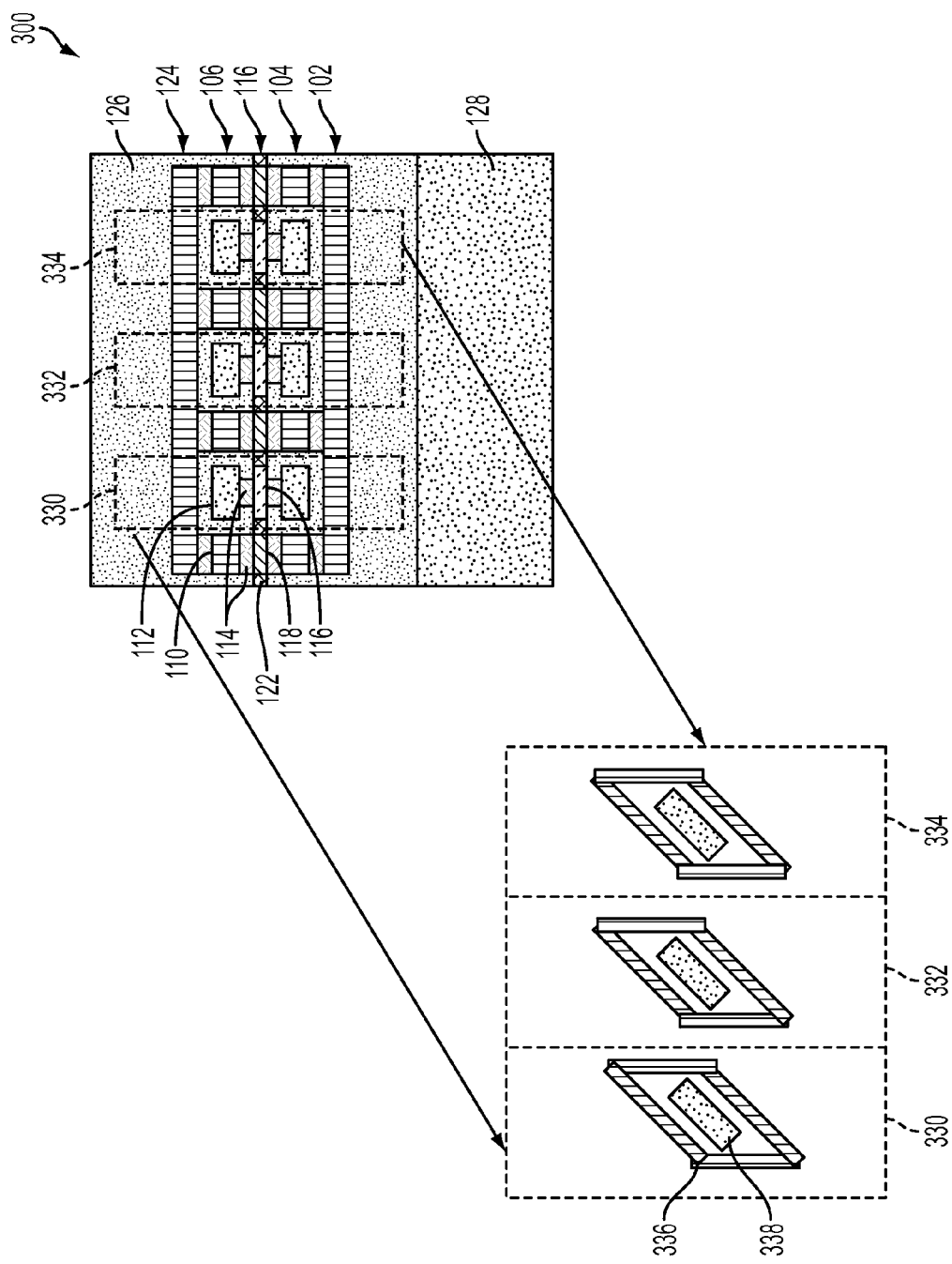
FIG. 3 is a side view with a corresponding perspective view of a three dimensional integrated circuit capacitor in accordance with one or more other embodiments.

FIG. 3 is a side view with a corresponding perspective view of a three dimensional integrated circuit capacitor 300 in accordance with one or more embodiments. The capacitor includes the first conductive layer 102 below the second conductive layer 104, the second conductive layer 104 below the third conductive layer 106 and the third conductive layer 106 below the fourth conductive layer 124.

The first conductive plate 110 in the third conductive layer 106 is electrically connected through the connection via 114 to the ILV 118. The ILV 118 passes through the semiconductor layer 116. The second conductive plate 112 is electrically connected through the p-well 120 and the connection via 114 in the third conductive layer 106, through the p-type doped semiconductor layer 116, to the connection via 114 and p-well 120 in the second conductive layer 104, to the second conductive plate 112 in the second conductive layer 104. Insulating layer 122 separates the semiconductor layer 116 and ILV 118. A portion of the capacitor 300 that includes the ILV 118 is a MOSCAP while portions above and below the MOSCAP are MOMCAPs. The capacitor 300 includes insulating layer 126 formed over a substrate 128.

The capacitor 300 includes a capacitive section 330 adjacent to a capacitive section 332. The capacitive section 332 is adjacent to a capacitive section 334. Capacitive sections 330, 332, 334 are shown in side view in an upper right portion of FIG. 3 and in perspective view in a lower left portion of FIG. 3. The first conductive plate 110 and the second conductive plate 112 with the capacitive sections 330, 332, 334 have vertical and/or horizontal fingers. The capacitive section 330 includes a rectangular-shaped first conductive plate portion 336 having a horizontal finger in the first conductive layer 102, a horizontal finger in the fourth conductive layer 124, and vertical fingers in four conductive layers 102, 104, 106, 124 electrically connected to the horizontal fingers. The capacitive section 330 includes a bar-shaped second conductive plate portion 338 having a horizontal finger in the second conductive layer 104 and a horizontal finger in the third conductive layer 106. The bar-shaped portion 338 fits inside the rectangular-shaped portion 336, as shown in FIG. 3, and is separated by insulating layers 122, 126. Capacitive sections 330, 332, 334 each have a similar rectangular-shaped portion 336 and bar-shaped portion 338. In some embodiments there are more than three capacitive sections 330, 332, 334; however, the number of capacitive sections is not limited to any particular numerical value.

The capacitor 300 has capacitive sections 330, 332, 334 that include the rectangular-shaped portions 336 and the bar-shaped portions 338 that form a three dimensional integrated circuit structure having MOSCAP and MOMCAP type portions. In some embodiments, circuits benefiting from a low loss, high electrical efficiency (high Q) capacitor employ capacitor 300 because of the high Q characteristics of the capacitor.

Figure 4A:
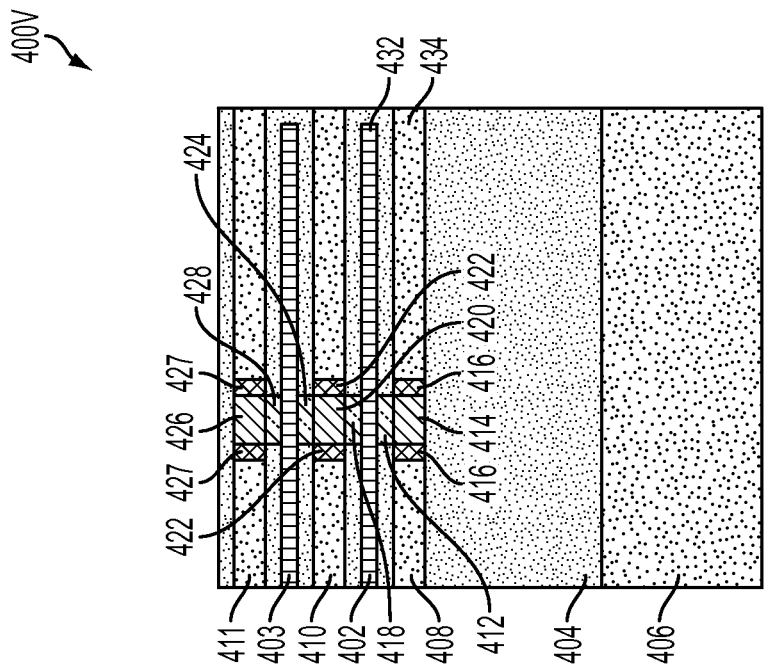
FIG. 4A is a side view of a three dimensional integrated circuit capacitor in accordance with one or more other embodiments.

FIG. 4A is a side view of a three dimensional integrated circuit capacitor 400 in accordance with one or more still other embodiments. The capacitor 400 includes a conductive gate layer 402 in an insulating layer 404. Both the conductive gate layer 402 and the insulating layer 404 are above a substrate 406. A first semiconductor layer 408 is below and spaced apart from gate layer 402. A second semiconductor layer 410 is above and spaced apart from gate layer 402. A first via 412 electrically connects the gate layer 402 with an inter layer via (ILV) 414 in the first semiconductor layer 408. The ILV 414 is separated from the first semiconductor layer 408 by the insulating layer 416. A second via 418 electrically connects the gate layer 402 with an inter layer via (ILV) 420 in the second semiconductor layer 410. The ILV 420 is separated from the second semiconductor layer 410 by insulating layer 422.

A third via 424 electrically connects the gate layer 402 with an inter layer via (ILV) 426 in the first semiconductor layer 408. The ILV 426 is separated from the first semiconductor layer 408 by the insulating layer 416. A fourth via 428 electrically connects the gate layer 402 with an inter layer via (ILV) 430 in the second semiconductor layer 410. The ILV 430 is separated from the second semiconductor layer 410 by insulating layer 422. In some embodiments, via 412, 418, 424, 428 are via array.

A first conductive plate 432 includes the conductive gate layer 402, via 412, 418, 424, 428, and ILVs 414, 420, 426, 430. A second conductive plate 434 includes the first semiconductor layer 408 and the second semiconductor layer 410. Capacitor 400 is formed by the first conductive plate 432 and the second conductive plate 434. Capacitor has MOSCAP portions horizontally spaced apart along the gate layer 402 and vertically spaced apart above and below the gate layer 402.

Figure 4B:
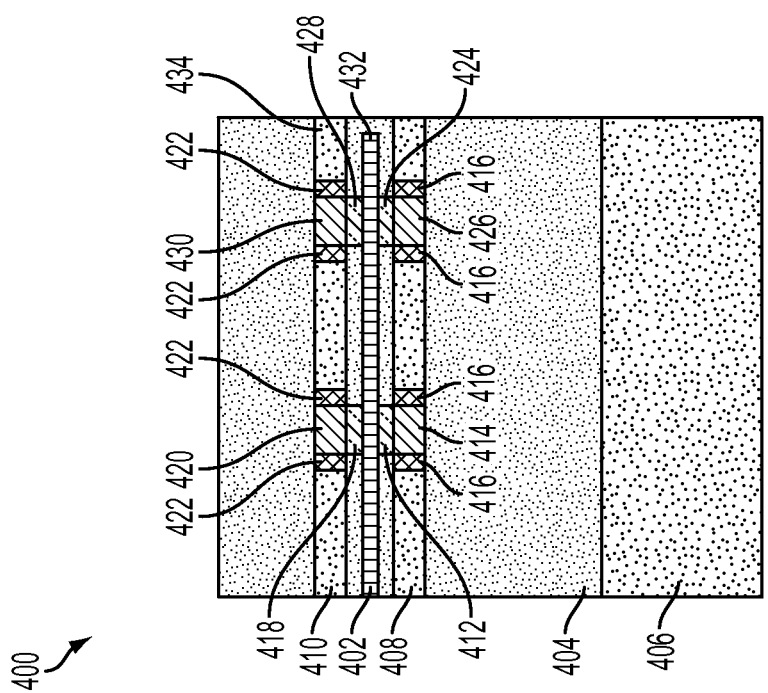
FIG. 4B is a side view of a three dimensional integrated circuit capacitor in accordance with one or more other embodiments.

FIG. 4B is a side view of a three dimensional integrated circuit capacitor 400V (vertical) in accordance with one or more still other embodiments. The capacitor 400V includes a first conductive gate layer 402 below a second conductive gate layer 403 in an insulating layer 404. Both the conductive gate layer 402 and the insulating layer 404 are above the substrate 406. A first semiconductor layer 408 is below and spaced apart from the gate layer 402. A second semiconductor layer 410 is above and spaced apart from first gate layer 402. A third semiconductor layer 411 is above and spaced apart from the second gate layer 403. A first via 412 electrically connects the first gate layer 402 with an inter layer via (ILV) 414 in the first semiconductor layer 408. The ILV 414 is separated from the first semiconductor layer 408 by the insulating layer 416. A second via 418 electrically connects the first gate layer 402 with an inter layer via (ILV) 420 in the second semiconductor layer 410. The ILV 420 is separated from the second semiconductor layer 410 by insulating layer 422.

A third via 424 electrically connects the ILV 420 to the second gate layer 403. A fourth p-well 428 electrically connects the second gate layer 403 with an inter layer via (ILV) 426 in the third semiconductor layer 411. The ILV 426 is separated from the third semiconductor layer 411 by insulating layer 427. In some embodiments, via 412, 418, 424, 428 are via array.

A first conductive plate 432 includes the first conductive gate layer 402, the second conductive gate layer 403, via 412, 418, 424, 428, and ILVs 414, 420, 426. A second conductive plate 434 includes the first semiconductor layer 408, the second semiconductor layer 410 and the third semiconductor layer 411. Capacitor 400V is formed by the by the first conductive plate 432 and the second conductive plate 434. Capacitor 400V has MOSCAP portions vertically spaced apart above and below the first gate layer 402 and the second gate layer 403.

One aspect of this description relates to a three dimensional integrated circuit capacitor. The capacitor includes a first conductive layer, a second conductive layer above the first conductive layer and a semiconductor layer above the second conductive layer, the semiconductor layer having an inter layer via (ILV) through the semiconductor layer. The capacitor also includes a third conductive layer above the semiconductor layer and a fourth conductive layer above the third conductive layer. The capacitor includes a first conductive plate having fingers on at least two of the first conductive layer, the second conductive layer, the third conductive layer and the fourth conductive layer and a second conductive plate having fingers on at least two of the first conductive layer, the second conductive layer, the third conductive layer and the fourth conductive layer. The capacitor also includes an insulating layer between the first conductive plate and the second conductive.

Another aspect of this description relates to a three dimensional integrated circuit capacitor. The capacitor includes a first conductive layer, a second conductive layer above the first conductive layer and a semiconductor layer above the second conductive layer, the semiconductor layer having an inter layer via (ILV) through the semiconductor layer. The capacitor also includes a third conductive layer above the semiconductor layer and a fourth conductive layer above the third conductive layer. The capacitor includes a first conductive plate having fingers on at least two of the first conductive layer, the second conductive layer, the third conductive layer and the fourth conductive layer, the first conductive layer electrically connected to the ILV and a second conductive plate having fingers on at least two of the first conductive layer, the second conductive layer, the third conductive layer and the fourth conductive layer, the fingers electrically coupled together through the semiconductor layer. The capacitor also includes an insulating layer between the first conductive plate and the second conductive plate.

Still another aspect of this description relates to a three dimensional integrated circuit capacitor. The capacitor includes a first semiconductor layer having a first inter layer via (ILV), a second semiconductor layer above the first semiconductor layer having a second ILV, and a first conductive gate layer between the first semiconductor layer and the second semiconductor layer electrically connected to the first ILV and the second ILV. The capacitor includes a first conductive plate, wherein the first conductive plate includes the first conductive gate layer, the first ILV and the second ILV. The capacitor includes a second conductive plate, wherein the second conductive plate includes the first semiconductor layer and the second semiconductor layer. The capacitor also includes an insulating layer between the first conductive plate and the second conductive plate.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A three dimensional integrated circuit capacitor, comprising:
   a first conductive layer;
   a second conductive layer above the first conductive layer;
   a semiconductor layer above the second conductive layer, the semiconductor layer having an inter layer via (ILV) through the semiconductor layer;
   a third conductive layer above the semiconductor layer;
   a fourth conductive layer above the third conductive layer;
   a first conductive plate having fingers on at least two of the first conductive layer, the second conductive layer, the third conductive layer and the fourth conductive layer;
   a second conductive plate having fingers on at least two of the first conductive layer, the second conductive layer, the third conductive layer and the fourth conductive layer; and
   an insulating layer between the first conductive plate and the second conductive plate.

2. The three dimensional integrated circuit capacitor of claim 1, wherein the first conductive plate further comprises:
   a connection via above and electrically connected to the ILV; and
   a connection via below and electrically connected to the ILV.

3. The three dimensional integrated circuit capacitor of claim 1, wherein a portion of the first conductive plate is electrically connected to the ILV.

4. The three dimensional integrated circuit capacitor of claim 1, wherein the three dimensional integrated circuit capacitor is a portion of a radio frequency (RF) circuit.

5. The three dimensional integrated circuit capacitor of claim 1, wherein the first conductive plate is U-shaped and the second conductive plate is T-shaped.

6. The three dimensional integrated circuit capacitor of claim 1, wherein the first conductive plate is U-shaped and the second conductive plate is T-shaped in a first capacitive section and the first conductive plate is T-shaped and the second conductive plate is U-shaped in a second capacitive section.

7. The three dimensional integrated circuit capacitor of claim 1, wherein the first conductive plate is rectangular-shaped and the second conductive plate is bar-shaped.

8. The three dimensional integrated circuit capacitor of claim 1, wherein the first conductive plate and the second conductive plate include a metal oxide metal capacitor (MOMCAP) portion and a metal oxide semiconductor capacitor (MOSCAP) portion.

9. A three dimensional integrated circuit capacitor, comprising:
   a first conductive layer;
   a semiconductor layer above the first conductive layer, the semiconductor layer having an inter layer via (ILV) through the semiconductor layer;
   a second conductive layer above the semiconductor conductive layer;
   a first conductive plate having first fingers on one of the first conductive layer and the second conductive layer, the first fingers electrically connected to the ILV;
   a second conductive plate having fingers on one of the first conductive layer and the second conductive layer, the second fingers electrically coupled to the semiconductor layer; and
   an insulating layer between the first conductive plate and the second conductive plate
   a metal oxide semiconductor capacitor (MOSCAP) having a metal portion, an oxide portion and a semiconductor portion, wherein the metal portion includes the ILV, the oxide portion includes at least a part of the insulating layer and the semiconductor portion includes at least a part of the semiconductor layer not including the ILV.

10. The three dimensional integrated circuit capacitor of claim 9, wherein the first conductive plate further comprises:

a connection via above and electrically connected to the ILV; and a connection via below and electrically connected to the ILV.

11. The three dimensional integrated circuit capacitor of claim 9, wherein a portion of the first conductive plate on the second conductive layer is electrically connected to the ILV.

12. The three dimensional integrated circuit capacitor of claim 9, wherein the first conductive plate is U-shaped and the second conductive plate is T-shaped.

13. The three dimensional integrated circuit capacitor of claim 9, wherein the first conductive plate is U-shaped and the second conductive plate is T-shaped in a first capacitive section and the first conductive plate is T-shaped and the second conductive plate is U-shaped in a second capacitive section.

14. The three dimensional integrated circuit capacitor of claim 9, wherein the first conductive plate is rectangular-shaped and the second conductive plate is bar-shaped.

15. The three dimensional integrated circuit capacitor of claim 9, wherein the first conductive plate and the second conductive plate include a metal oxide metal capacitor (MOMCAP).

16. A three dimensional integrated circuit capacitor, comprising:
   a first semiconductor layer having a first inter layer via (ILV);
   a second semiconductor layer above the first semiconductor layer having a second ILV;
   a first conductive gate layer between the first semiconductor layer and the second semiconductor layer electrically connected to the first ILV and the second ILV;
   a first conductive plate,
   wherein the first conductive plate includes the first conductive gate layer, the first ILV and the second ILV;
   a second conductive plate,
   wherein the second conductive plate includes the first semiconductor layer and the second semiconductor layer; and
   an insulating layer between the first conductive plate and the second conductive plate,
   wherein the first conductive plate and the second conductive plate form a metal oxide semiconductor capacitor (MOSCAP).

17. The three dimensional integrated circuit capacitor of claim 16, further comprising:
   a second gate layer above the second semiconductor layer, the second gate layer electrically connected to the second ILV,
   wherein the first conductive plate includes the second gate layer; and
   a third semiconductor layer above the second gate layer, the third semiconductor layer electrically connected to the second semiconductor layer,
   wherein the second conductive plate includes the third semiconductor layer.

18. The three dimensional integrated circuit capacitor of claim 16, wherein the first conductive plate further comprises:
   a connection via above and electrically connected to the ILV; and
   a connection via below and electrically connected to the ILV.

19. The three dimensional integrated circuit capacitor of claim 16, wherein a portion of the first conductive plate is electrically connected to the ILV.

20. The three dimensional integrated circuit capacitor of claim 16, wherein the MOSCAP comprises a first MOSCAP portion between the first semiconductor layer and the first conductive gate layer, and a second MOSCAP portion between the first conductive gate layer and the second semiconductor layer.

* * * * *